United States Patent [19]
Anderson et al.

[11] Patent Number: 6,100,712
[45] Date of Patent: Aug. 8, 2000

[54] OUTPUT DRIVER CIRCUIT WITH JUMP START FOR CURRENT SINK ON DEMAND

[75] Inventors: Alma Stephenson Anderson, Rio Rancho; David William Oehler, Albuquerque, both of N. Mex.

[73] Assignee: Philips Electronics North America Corporation, New York, N.Y.

[21] Appl. No.: 08/992,290

[22] Filed: Dec. 17, 1997

[51] Int. Cl.[7] .......................... H03K 19/01; H03K 19/08
[52] U.S. Cl. ................................ 326/18; 326/84; 326/110
[58] Field of Search .............................. 326/84, 109–110, 326/17–18, 82–83, 86

[56] References Cited

U.S. PATENT DOCUMENTS

| | | | |
|---|---|---|---|
| 5,278,463 | 1/1994 | Denda | 326/110 |
| 5,559,451 | 9/1996 | Okamura | 326/84 |
| 5,570,044 | 10/1996 | Martin et al. | 326/84 |

*Primary Examiner*—Jon Santamauro
*Attorney, Agent, or Firm*—Brian J. Wieghaus

[57] ABSTRACT

An output driver circuit for coupling a logic circuit to load includes an input node, an output node for coupling to the load and a pull down switch which discharges the output node in response to a signal received at the input node. A current sink circuit includes a feeder transistor which provides current to the control terminal of the pull down switch to render the pull down switch conductive when the voltage at the output node exceeds a first threshold value between a logic high and a logic low. The feeder transistor is charged by a first charging path having a first impedance by which it takes a first time period to render the pull down switch conductive, the first impedance providing a low standby current when the voltage at the output node is below about the first value. A jump start circuit having a second current path with a lower impedance than the first current path charges the control terminal of the feeder transistor to said threshold faster than said first path and is disabled when the voltage at the output node falls below about the first value, thereby saving power.

13 Claims, 2 Drawing Sheets

OUTPUT DRIVER CIRCUIT WITH JUMP START FOR CURRENT SINK ON DEMAND

BACKGROUND OF THE INVENTION

The invention relates to an output driver circuit connected between a first supply terminal and second, lower supply terminal for driving a load and having an input node for receiving an input signal and an output node for connection to the load;

a pull down switch having a control terminal and a current channel coupled between the output node and the second, lower supply terminal, the control terminal being coupled to the input node and rendering the current channel conductive to discharge the output node in response to a selected signal at the input node; and a current sink circuit controlling the pull down switch to discharge the output node in response to a selected voltage at the output node, the current sink circuit including (i) a feeder switch having a control input and a current channel coupling the first supply to the control terminal of the pull down switch, and (ii) a first charging path coupling the first supply to the control terminal of the feeder switch in response to receipt of the selected signal at the input node.

Such an output driver circuit is known from U.S. Pat. No. 5,570,044 (Martin et al). One use of the circuit is for interfacing a logic circuit with a load, such as a bus. For example, upon a transition from a logic high to a logic low at the input terminal, the pull down transistor is rendered conductive, rapidly pulling the output terminal from logic high to logic low. The pull down transistor is then turned off, saving power. Under certain load conditions, it is possible for the voltage at the output terminal after having been initially pulled to a logic low to bounce back up to a higher voltage sufficient to be read as a logic high. Thus, an error or glitch is present in that the logic level at the output terminal does not mirror the signal at the input terminal.

To overcome this glitch, the current sink circuit further includes a feeder switch that provides current to charge the control terminal of the pull down switch if the voltage at the output node bounces above a first selected value. The feeder switch is charged by a charging path from the first supply terminal to the base of the feeder switch, and is enabled when the input transitions to a logic low. The response of the circuit in turning on the pull down switch to discharge voltage bounces at the output node is a limiting factor in the speed of the circuit.

Accordingly, it is the object of the invention to improve the speed of the driver circuit in responding to and discharging voltage bounces.

It is another object of the invention to improve the speed without increasing the static power consumption of the circuit.

SUMMARY OF THE INVENTION

Generally speaking, according to the invention, a driver circuit according to the opening paragraph is characterized in that:

the first charging path has a first impedance by which it takes a first time period after receipt of the selected signal at the input node to charge the control terminal of the feeder switch to a threshold which renders the feeder switch conductive, and the driver circuit further includes an auxiliary charging path coupling the first supply to the control terminal of the feeder switch in response to the selected signal at the input node, the second current path having a lower impedance than the first charging path and charging the control terminal of the feeder switch to the threshold in a time period shorter than the first time period.

The invention is based on the recognition that the speed of the circuit in reacting to voltage bounces after the initial discharge of the output node was limited by the speed of charging of the feeder switch to its conductive state. The speed of charging was limited in turn by the need to have a low standby current when the output voltage was at logic low, so as to be near the ideal of zero static power. The first charging path then was required to include a fairly high resistance, which together with inherent capacitance in the circuit, resulted in a high impedance (RC time constant) and an undesirably slow initial charging of the feeder switch. By the measure according to the invention, the auxiliary charging path has a much lower impedance than the first charging path of the current sink circuit, and charges the feeder switch to its conducive state more quickly than the first charging path.

Favorably, the current sink circuit includes a discharge circuit for discharging the control terminal of the switch whenever the voltage at the output node is pulled below a first value between logic high and logic low. When the output voltage is below the first value, no current is supplied from the first voltage supply to the control terminal of the pull down switch, and only a low standby current flows through the first charging path to the control terminal of the feeder switch and from the base of the feeder switch to the output node via the discharge circuit. The auxiliary path is enabled only when the output voltage is above the first voltage value. In operation, therefore, the auxiliary charging path is enabled for only a relatively short time, beginning when the input signal has transitioned to the selected logic value until the output node has been pulled from the initially high logic level. Once the output node is pulled below the first value, only the low standby of the first charging path flows. Accordingly, low power dissipation is maintained in the static state while the response of the circuit is greatly improved due to the more rapid charging of the feeder switch to its conductive state.

These and other object, features and advantages of the invention will become apparent with reference to the following detailed description and the drawings.

DETAILED DESCRIPTION OF THE PREFERRED EMBODIMENTS

Figure 1:
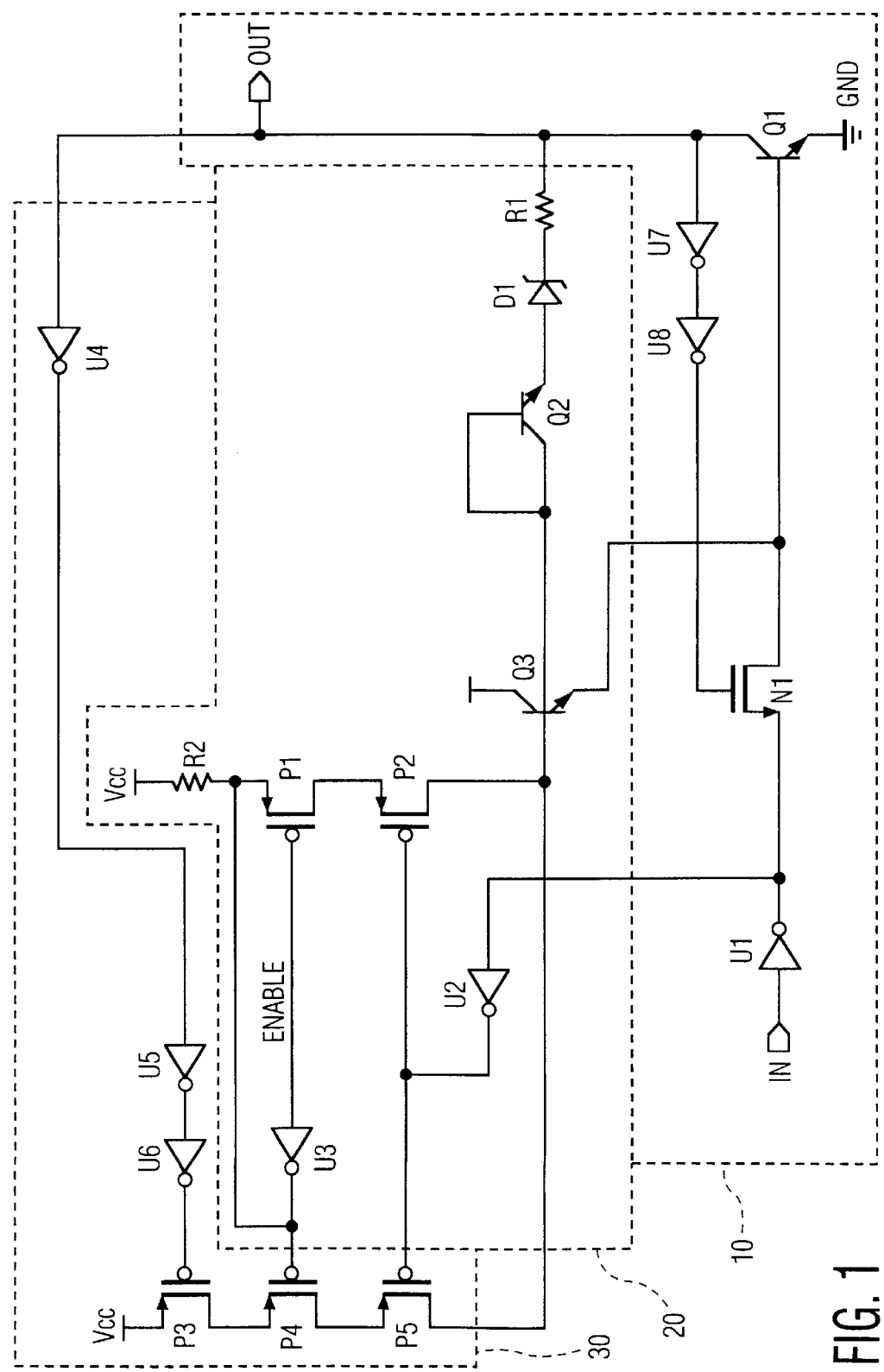
FIG. 1 is a schematic of a preferred embodiment of the output driver circuit according to the invention.

With reference to FIG. 1, the output driver circuit according to the invention includes a first circuit portion 10, a second circuit portion 20 which provides a current-sink on demand function, and a third circuit portion 30 which provides a jump start function to the current-sink on demand function.

The first circuit portion 10 includes an input node IN and an output node OUT, which output node is normally connected to and drives an external load, such as a bus. A pull down device in the form of a bipolar NPN transistor Q1 has its collector coupled to the output node OUT and its emitter connected to a reference supply terminal, in this case ground. The input node IN is coupled to an input device, an inverter U1, whose output is coupled to the control terminal of the pull down device, i.e. the base of the transistor Q1, by an NMOS switch N1. The control terminal of NMOS device N1 is connected to the output node via series inverters U7 and U8. In the initial condition, both nodes IN and OUT are logic high (the node OUT being pulled high by circuitry not shown), and device N1 is conductive. When the logic signal at the input node IN transitions from a logic high to a logic low, the output of the inverter U1 transitions from low to high. This logic high voltage applied to the base of transistor Q1 renders transistor Q1 conductive, pulling the voltage at the output node OUT from a high logic level to a low logic level, in other words to a voltage of $V_{SAT}$ above the ground potential. After the output is pulled to logic low, switch N1 opens, depriving Q1 of base drive current.

In practice, the voltage at the output node OUT does not always smoothly transition from logic high to logic low and remain at the logic low level. Rather, the voltage at the node OUT is subject to a so-called "bounce effect". Because a fair amount of charge is discharged from the output node in a rapid fashion, the voltage at the output node does not fall smoothly from logic high (in this case about 3V) to logic low (about $V_{SAT}$). Rather the voltage first overshoots logic low in the negative direction, reverses back in the positive direction towards logic high and then reverses again towards logic low. In other words, it takes a finite time for the output voltage to settle to a stable logic low, during which settling time the voltage may bounce back up sufficiently high to be considered a logic high. This settling time reduces the speed of the circuit. Ringing or noise in the external load may also cause the voltage at node OUT to become logic high again, despite the input node IN being logic low. Thus, an error occurs since the output node does not reflect the input condition. While transistor Q1 could be kept conductive to always discharge the output node, this would significantly increase the power demand of the device and is not an acceptable solution for most applications, especially ones powered by battery.

The second circuit portion 20 provides a current-sink on on demand function which acts to turn on the transistor Q1 if the voltage at the output bounces above a predetermined level, but which supplies no current to the base of switch Q1 when the output node is at a logic low level. Thus, the extra sink current is suppled only when needed to prevent such glitches. The second circuit portion includes a bipolar feeder transistor Q3, whose collector is connected to supply Vcc and whose emitter is connected to the base of the transistor Q1. The base of the transistor Q3 is connected to the drain of a first P-type MOSFET P2, whose source is connected to the drain of a second P-type MOSFET P1. The source of MOSFET P1 is connected to the supply Vcc via the resistor R2. The control gate of the MOSFET P1 is coupled to an enable input by inverter U3, and the control gate of the MOSFET P2 is coupled to the output of the inverter U1 by a second inverter U2. The base voltage of the transistor Q3 is controlled by the series connection of the resistor R1, the Schottky diode D1 and the transistor Q2.

The current-sink on demand circuit 20 functions as follows. When the enable signal is high, the output of inverter U3 is low, which renders the main current path of the switch P1 conductive. In the initial condition, both the input IN and the output OUT are logic high, and both the pull down transistor Q1 and the feeder transistor Q3 are non-conductive. When the logic signal at the input IN transitions from high to low, the output of the inverter U1 switches high and the output of the inverter U2 goes low, also rendering conductive the main current path of the second switch P2. In this instant, a conductive path extends from the supply terminal Vcc to the base of the feeder transistor Q3 via the resistor R2 and the main current paths of MOSFETs P1 and P2. This enables the base of transistor Q3 to be charged sufficiently to render it conductive, depending on the voltage at the node OUT. Typically, pull-down transistor Q1 sinks node OUT and then its base drive is cut off by switch N1 before the base of device Q3 is charged sufficiently to be conductive. When the voltage at node OUT is below a first value of about 200 mV, the diode D1 and transistor Q2 (which functions as a diode) are forward biased and drain current from the base of transistor Q3, so that it is not conductive and does not provide current to the base of the pull down device Q1. Now, if the voltage at node OUT increases above the first value of about 200 mV due to bounce or effects from the bus, the diodes D1 and Q2 are no longer forward biased, so that the base of feeder transistor Q3 is not discharged. This renders transistor Q3 conductive, which supplies base drive to pull down transistor Q1, which then sinks node OUT. When the voltage at node OUT falls again below about 200 mV, transistor Q3 and subsequently transistor Q1 are turned off and will remain off until the voltage at node OUT again rises above about 200 mV.

Thus, the circuit portion 10 acts to rapidly pull the node OUT low upon initial transition of the input signal from high to low by sinking large load currents quickly to ground. The circuit 20 is used to suppress glitches at the output node by turning the pull down switch Q1 back on as a result of voltage bounce. However, the response time of circuit 20 in sinking voltage bounces has been found to be a limiting factor in the speed of the circuit. This is due to the amount of time it takes for circuit 20 to charge up sufficiently to turn on pull down device Q1 and is caused by capacitance in the circuit which, in conjunction with the resistance of the resistor R2, imposes an RC time constant which limits the rate of charging of the base of feeder transistor Q3. Lowering the resistance of the resistor R2 would lower the RC time constant and its associated delay. However, this resistance must be kept sufficiently high to limit the standby current which flows through devices R2, P1, P2, Q2, D1 and R1 when the voltage at the output node is low enough for the devices D1 and Q2 to be forward biased. This standby current flows whenever the input signal is at logic low and the voltage at the output node is at logic low (i.e. after node OUT has been pulled low initially and after any bounce has been pulled low). In practice it has been found that the resistance of resistor R2 cannot be lowered sufficiently to decrease this delay to a satisfactory level.

In order to overcome this problem, in accordance with the invention, an additional circuit portion 30 is provided which charges the base of feeder transistor Q3 more rapidly than the devices R2, P1, P2. Circuit portion 30 includes three inverters U4, U5, U6 and three additional P-type MOSFETs P3, P4, P5. The base of the transistor Q3 is connected to the drain of MOSFET P5. The source of MOSFET P5 is connected to the drain of MOSFET P4, whose source is in turn connected to the drain of MOSFET P3. The source of MOSFET P3 is coupled to the supply Vcc. The output of inverter U2 is coupled to the control terminal of the MOSFET P5. The control terminal of the MOSFET P4 is coupled to the enable input via the inverter U3. The control terminal of switch P3 is coupled to the output node OUT via the series connection of the inverters U4, U5 and U6.

Now, whenever the enable signal is logic high the MOSFET P4 (and also MOSFET P1) are conductive. When the input signal IN is high, the node OUT is pulled high (by circuitry not shown). With node OUT high, the output of inverter U6 is logic low and the MOSFET P3 is conductive. Thus, before the input transitions from a logic high to a logic low, both MOSFETS P3 and P4 are conductive, but MOSFET P5 is non-conductive. Now, when the input signal transitions, the output of inverter U1 becomes high and the output of inverter U2 becomes low. This turns device P5 and P2 conductive at the same time. The series connection of the MOSFETs P3–P5 has a much lower resistance than the series string consisting of devices R2, P1, P2, so the RC time constant of string P3–P5 is also much lower. Consequently, the base of transistor Q3 is charged much more rapidly by circuit portion 30 than by the string containing device R2. Circuit 30 thus effectively jump starts the current-sink on demand circuit 20 by enabling feeder transistor Q3 to be conductive at an earlier time after the high-to-low transition of the input signal. Now, when the voltage at node OUT is pulled low initially by transistor Q1, this signal propagates though the inverter string U4, U5, U6 to turn off (render non-conductive) the MOSFET P3. This stops the charging of the base of transistor Q3. However, this occurs after P5 turns on because the propagation of the signal through inverter U2 (after inverter U1 goes high) is faster than the time it takes for pull down transistor Q1 to initially pull node OUT low and for this signal to propagate through the string U4, U5 and U6 to render MOSFET P3 non-conductive. Thus, upon the high to low transition of the input signal, the jump start circuit rapidly charges the base of feeder transistor Q3 and then turns off when the node OUT is initially pulled low. Since the current-on-demand circuitry suppresses the bouncing at node OUT, node OUT does not get high enough for a time long enough to propagate a signal back through to turn P3 back on, so no further charging from the jump-start path occurs. Consequently, there is no further power drain from the path P3, P4, P5. The combination of the jump start circuit 30 with the current-sink on demand circuit 20 therefore has the advantage of ensuring that the voltage bounce at the output can be handled more quickly while maintaining the advantage of the very low standby current as a result of the resistor R2.

Figure 2:
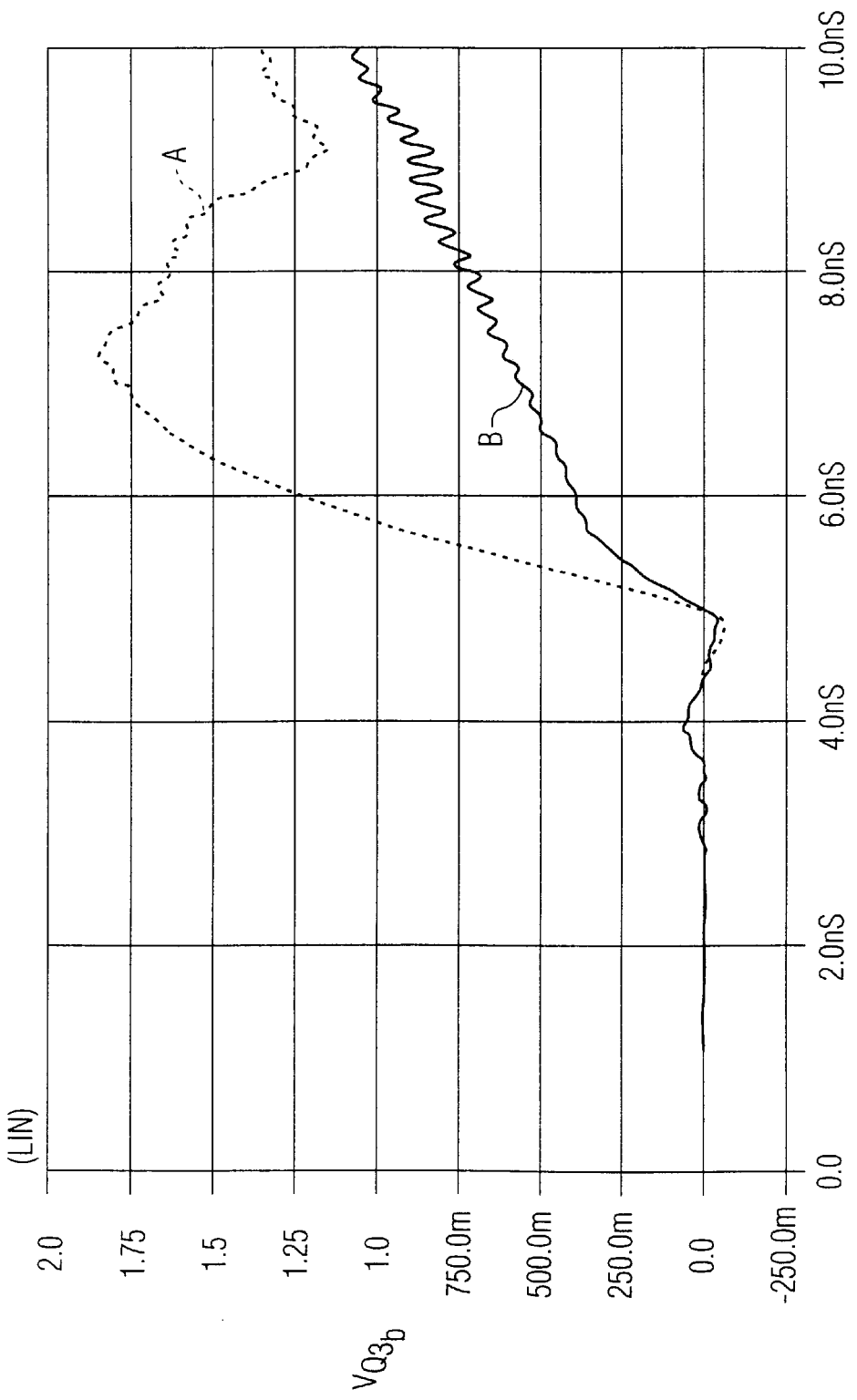
FIG. 2 is a graph comparing the charging time of the base of the feeder switch with and without the improvement according to the invention.

FIG. 2 is a graph illustrating the reduced charging time of the base of the feeder switch Q3 by the circuit according to the inventor. The vertical axis is the voltage on the base of Q3 in volts while the horizontal axis is time in nanoseconds, with time 0 representing when the input is still logic high prior to transition to logic low. The dashed line A represents the base voltage of switch Q3 with the jump start circuit according to the invention while the solid line B represents the base voltage of switch Q3 without the jump start circuit 30. As illustrated in FIG. 2, with the circuit according to the invention, the base of switch Q3 is charged to about 1.4V (to render it conductive) in just over 6 nanoseconds. At this same time, the prior art circuit as represented by the solid line B has only charged the base of switch Q3 to about 400 mV. With the prior art circuit the base voltage of switch Q3 would not be charged to 1.4V until about 12 nanoseconds, or twice the charging time of the jump start circuit according to the invention. The slope of line B could be increased to decrease the charging time by decreasing the resistance of resistor R2, but this would undesirably increase the standby current of the current sink circuit 20.

The above circuit was implemented in BiCMOS technology due to its favorable characteristics with respect to low power consumption. However, the principles of the invention can be embodied in other processes or technologies, such as any of the standard bipolar, NMOS or CMOS processes. Also, it will be clear from the foregoing that other variations can be made without departing from the principles described herein. For example, the devices P1 and P4 could be eliminated where control by an enable signal is not required. Also, for example, the number and nature of the components may be varied to trigger the disclosed functions at different voltage levels. Accordingly, while the preferred embodiments of the present invention have been shown and described, it will be appreciated by those skilled in the art that changes may be made in these embodiments without departing from the principles and spirit of the invention, the scope of which is defined in the claims.

The many features and advantages of the invention are apparent from the detailed specification and it is intended by the appended claims to cover all such features and advantages which fall within the true spirit and scope of the invention. Since numerous modifications and changes will readily occur to those skilled in the art, it is not desired to limit the invention to the exact construction and operation illustrated and described, and accordingly all suitable modifications and equivalents may be resorted to, falling within the scope of the invention.

What is claimed is:

1. A driver circuit connected between a first supply terminal and second, lower supply terminal for driving a load, said driver comprising an input node for receiving an input signal and an output node for connection to the load;

a pull down switch having a control terminal and a current channel coupled between the output node and the second, lower supply terminal, said control terminal being coupled to said input node and rendering said current channel conductive to discharge said output node in response to a selected signal at said input node;

a current sink circuit controlling said pull down switch to discharge the output node in response to a selected voltage at said output node, said current sink circuit including (i) a feeder switch having a control input and a current channel coupling the first supply to said control terminal of said pull down switch, (ii) a first charging path coupling the first supply to said control terminal of said feeder switch in response to receipt of the selected signal at said input node, and (iii) a discharge circuit which discharges said control terminal of said feeder switch when the voltage at the output node is equal to or less than a first value, characterized in that:

said first charging path has a first impedance by which it takes a first time period after receipt of the selected signal at said input node to charge said control terminal of said feeder switch to a threshold which renders said feeder switch conductive, and said driver circuit further comprising an auxiliary charging path coupling the first supply to the control gate of said feeder switch in response to the selected signal at said input node, said second current path having a lower impedance than said first charging path and charging said control terminal of said feeder switch to the threshold in a time period shorter than said first time period.

2. A driver circuit according to claim 1, wherein said discharge circuit comprises a discharge path coupling the control gate of the feeder switch to the output node, said discharge path including at least one breakdown element.

3. A driver circuit according to claim 1, wherein, when said discharge circuit discharges said control terminal of said feeder switch, a relatively low standby power is dissipated through (i) said first charging path and (ii) said discharge circuit relative to the electrical power dissipated through said auxiliary charging path when said auxiliary charging path charges said control terminal of said feeder switch, and further comprising means for disabling said auxiliary path whenever the voltage at said output node is equal to or less than or equal to the first value, whereby only relatively low power is dissipated whenever the voltage at the output node is equal to or less than the first value and only relatively high power is dissipated through the auxiliary charging path whenever the voltage at the output node is above the first value.

4. A driver circuit according to claim 1, wherein said auxiliary charging path includes a first control switch switchable between a conductive and a non-conductive state to control the charging of said control terminal of said feeder switch, said first control switch including a control terminal coupled to said input node, said first control switch being rendered conductive in response to the selected signal at said input node.

5. A driver circuit according to claim 4, wherein said first control switch is a MOSFET.

6. A driver circuit according to claim 5, wherein said auxiliary charging path includes a second control switch switchable between a conductive and a nonconductive state for controlling the charging of said control terminal of said feeder switch, and further includes means coupled to said output node for switching said second control switch to the conductive state when the voltage at the output node exceeds a second value and for switching said second control switch to the non-conductive state when the voltage at the output need is less than or equal to the second value.

7. A driver circuit according to claim 6, wherein the first value is substantially equal to the second value.

8. A driver circuit according to claim 6, wherein said second control switch is a MOSFET.

9. A driver circuit according to claim 1, wherein said auxiliary charging path includes a control switch switchable between a conductive and a nonconductive state for controlling the charging of said control terminal of said feeder switch, and further comprising means for switching said control switch to the conductive state when the voltage at the output node exceeds a second value and for switching said control switch to the non-conductive state when the voltage at the output need is less than or equal to the second value.

10. A driver circuit according to claim 9, wherein the first value is substantially equal to the second value.

11. A driver circuit according to claim 8, wherein said control switch is a MOSFET.

12. A driver circuit according to claim 1, wherein said pull down switch and said feeder switch are bipolar transistors.

13. A BiCMOS logic output driver circuit connected between a first supply terminal and second, lower supply terminal for driving a load, said driver comprising:

an input node for receiving an input logic signal transitioning from a logic high value to a logic low value and an output node for connection to the load;

a bipolar pull down transistor, said pull down transistor having a base, a collector coupled to said output node and an emitter coupled to said second, lower supply terminal, said base being coupled to said input node and rendering said bipolar transistor conductive to discharge said output node in response to a selected logic value at said input node;

means for rendering said pull down transistor nonconductive upon said pull down transistor initially discharging said output node upon receipt of the selected logic value at said input node;

a current sink circuit controlling said pull down transistor to discharge the output node whenever the voltage at said output node rises above a first value, said current sink circuit including (i) a bipolar feeder transistor having a base, a collector coupled to the first supply and an emitter coupled to the base of said pull down transistor, (ii) a first charging path for charging said base of said feeder transistor, said first charging path including a first control MOSFET having a current path coupling the first supply to said base of said feeder transistor and a control gate coupled to said input node, said first control MOSFET being conductive whenever the selected logic signal is present at said input node, said first charging path having a first impedance by which it takes a first time period after receipt of the selected logic signal at said input node to charge the base of said bipolar feeder transistor to a threshold which renders said feeder transistor conductive, and (iii) discharging means comprising at least one breakdown element for discharging said base of said feeder transistor to render said feeder transistor non-conductive whenever the voltage at said output node is below the first value, a standby current flowing through said first charging path whenever said discharging means discharges said base of feeder transistor; and a jump start circuit including an auxiliary charging path coupling the first supply to said base of said feeder transistor, said auxiliary charging path including second and third control MOSFETs having respective current channels serially coupling the first supply to said base of said feeder transistor, said second MOSFET having a control gate coupled to said input node, said current channel of said second MOSFET being rendered conductive whenever said input signal is at the selected logic value, and said control gate of said third MOSFET being coupled to said output node such that said current channel of said third MOSFET is conductive whenever the voltage at said output node is above the first value and non-conductive whenever the voltage a said output node is equal to or less than the first value, prior to transition of the input signal from a logic high value to a logic low value, the output node being above said first value and said third control MOSFET being conductive, and upon transition of the input signal to the logic low value, said second control MOSFET being conductive and said auxiliary charging path charging said base of said feeder switch to said threshold, whereupon said pull down switch initially discharges the output node, rendering said third control MOSFET non-conductive and disabling said auxiliary charging path, whereby only the standby current flows to the base of said feeder transistor whenever the voltage at the output node is equal to or less than the first value.

* * * * *